United States Patent [19]

Rosler et al.

[11] Patent Number: 4,491,606
[45] Date of Patent: Jan. 1, 1985

[54] SPACER FOR PREVENTING SHORTING BETWEEN CONDUCTIVE PLATES

[75] Inventors: Richard S. Rosler, Paradise Valley; George M. Engle, Scottsdale, both of Ariz.

[73] Assignee: Advanced Semiconductor Materials of America, Inc., Phoenix, Ariz.

[21] Appl. No.: 492,545

[22] Filed: May 9, 1983

Related U.S. Application Data

[63] Continuation of Ser. No. 320,453, Nov. 12, 1981, abandoned.

[51] Int. Cl.³ .................... C23C 13/08; C23C 13/04
[52] U.S. Cl. ................................. 427/38; 427/39; 118/723; 118/728
[58] Field of Search ............ 118/723, 50.1, 728; 427/38, 39; 204/164, 298; 174/211, 212, 149 B; 422/186.05

[56] References Cited

U.S. PATENT DOCUMENTS 3,764,838 10/1973 Charpentier .................... 174/212 X
4,223,048 9/1980 Engle, Jr. ........................ 427/86 X Primary Examiner—Norman Morgenstern
Assistant Examiner—Bernard F. Plantz
Attorney, Agent, or Firm—Weiss & Holloway

[57] ABSTRACT

An improved spacer means for separating and inhibiting the shorting together of conductive plates in an RF plasma reactor used in Plasma Enhanced Chemical Vapor Deposition (PECVD) processing of semiconductor devices. The improved spacer means inhibits the accumulation of conductive films on the surface of the separating means by substantially precluding the plasma field, and hence, inhibiting depositions in areas where recessed grooves are in the surface of the separating means. Accordingly, a direct electrical path on the spacer means between the multiple conductive plates of the RF plasma reactor is inhibited. As a result, the reactors can run for longer periods of time and deposit greater thicknesses of conductive films without the conductive plates shorting together causing shutdown of the process.

9 Claims, 3 Drawing Figures

SPACER FOR PREVENTING SHORTING BETWEEN CONDUCTIVE PLATES

This application is a continuation of application Ser. No. 320,453, filed Nov. 12, 1981, now abandoned.

RELATED APPLICATION

The patent application "Improved Plasma Deposition of Silicon", filed on even data herewith by the co-inventors hereof, relates to the subject matter of this application.

BACKGROUND OF THE INVENTION

1. Field of the Invention

This invention relates generally to RF plasma deposition systems, and more specifically, to features for providing improved Plasma Enhanced Chemical Vapor Deposition (PECVD) systems for depositing conductive films in RF plasma reactors.

2. Description of the Prior Art

In the past, RF plasma reactors have been used extensively during various processing steps in the fabrication of semiconductor devices, such as photo resist removal, etching of silicon compounds, and more recently, for the deposition and growth of conductive and dielectric films. Plasma technology (PECVD) offers the advantages of being clean, uniform, easily regulated, and well-adapted for automation. In particular, large amounts of research have been directed to developing production quality RF plasma reactors for deposition of conductive films such as doped polysilicon, and conductive and expitaxial films.

Originally, RF plasma reactors for use in the deposition of films during semiconductor device fabrication, so called "glow-discharge reactors", were comprised of an evacuated quartz reaction chamber, the inside of which was a radiantly-heated semiconductor substrate holder, and a source of RF power through a two-turn coil surrounding the reactor immediately above the substrate holder. The reactant gases, the elements of which determine what type of film will be deposited, were usually mixed prior to being introduced into the bottom of the chamber.

The deposition procedure consisted of placing the workpieces on or in the holder, evacuating the reaction chamber, and initiating the plasma field (a partially ionized gas induced by a strong electric field, and comprised of neutral species, ions, and electrons) above the substrate by introducing the reactant gas into the RF field in the reactant chamber. In this manner, the reactant gas is ionized, or compounds can be formed by introducing subsequent reactants, for depositing the desired ions, compounds, or neutral molecules on the exposed surface of the wafer. The thickness of the film is controlled by varying, independently of one another, the temperature, pressure, concentration of reactants, and strength of the RF field.

A major problem with the original RF plasma reactors was the very limited number of workpieces that could be processed at one time. Eventually, the capacity of RF plasma reactors equalled or exceeded that of morre conventional thermal deposition systems. The inside of the reactor tubes consisted of a plurality of conductive plates, electrically isolated from one another by quartz (or similar non-conductive materials) spacers. RF power was applied to alternate conductors to produce a plasma field in the space between adjacent conductors. On the side of each conductor were pockets in which semiconductor wafers were placed. In some larger systems, in excess of 90 wafers could be processed in a single reactor tube. An exemplary system is described in U.S. Pat. No. 4,223,048, issued Sept. 16, 1980 to George M. Engle, Jr., a co-applicant for this invention.

The larger, production sized RF Plasma Reactors operated on the same principle as the earlier type PECVD systems. However, it was often impossible to run the reactors for more than a very short period of time, during which only a small deposition could be produced on the semiconductor wafers. This problem became especially prevalent when RF plasma reactors were used in PECVD of conductive films, and resulted largely from the thermal deposition of the conductive material on the spacer means. If the RF reactors were run for relatively longer periods of time, the deposited film would accumulate on the insulative spacers between adjacent conductive plates. As a result, and especially when depositing conductive films, adjacent conductive plates would be shorted together by the accumulated conductive film on the spacers. This would cause the plasma field to break down and the deposition process to stop. Even where a single deposition run could be completed without failure, system dismantling for cleaning raised costs and limited throughput.

The problem of curtailed run times and shorting together of the conductive plates prevented the most advanced RF plasma reactors from being used in efficient, production rate PECVD systems.

There existed a need to provide a means for isolating and preventing the shorting together of adjacent conductive plates in RF plasma reactors, so that the plasma enhanced chemical vapor deposition (PECVD) of conductive or other films onto semiconductor wafers can be done at a production rate in production lot sizes, and so that a multiplicity of runs could be effected without the necessity for dismantling and cleaning the system.

SUMMARY OF THE INVENTION

It is an object of this invention to provide an improved spacer means for separating and preventing the shorting together of the conductive plates in RF plasma reactors.

It is another object of this invention that the improved spacer means for separating and preventing the shorting together of the conductive plates be a compatible replacement for current types of means for separating conductive plates in RF plasma reactors.

It is a final object of this invention that the improved spacer means for separating and preventing or at least inhibiting the shorting together of the conductive plates to allow the RF plasma reactor to run for longer periods of time so that greater thicknesses of conductive films and/or a greater number of deposition runs can be achieved with practical production levels.

The above and other objects are achieved in an RF plasma reactor for depositing conductive films by Plasma Enhanced Chemical Vapor Deposition (PECVD) which includes an insulating spacer means for spacing apart adjacent conductive plates located in the RF plasma reactor, the conductive plates producing an RF plasma field; and groove or slot means located on the insulated spacer means for preventing or at least inhibiting the deposition of the conductive films entirely across the insulating spacer means. The deposition of the conductive film onto the separating means is prevented by largely precluding the plasma field in the area proximate the groove means. As a result, a direct electrical path between adjacent conductive plates does not form, or at least will form only at a very much reduced rate as compared withe prior art spacer means and the deposition process can continue for longer, production length periods of time, and with increased productivity.

The foregoing and othe objects, features, and advantages will be apparent from the following, more particular, description of the preferred embodiments of the invention, as illustrated in the accompanying drawings.

THE SPECIFICATION

Figure 1:
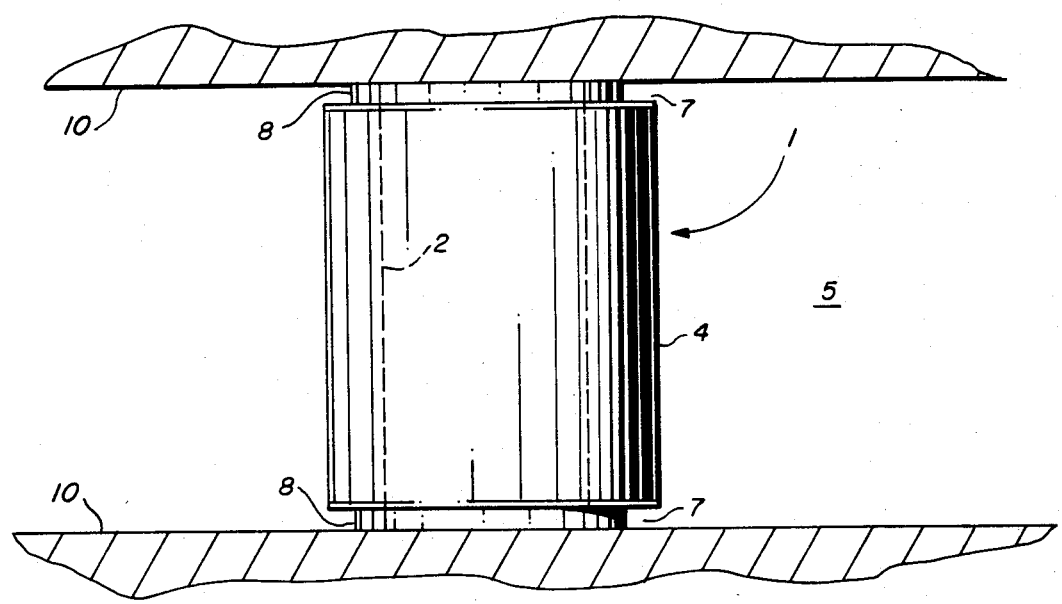
FIG. 1 is a side elevational view of the inventive spacer member positioned between two conductive plate portions which are shown in section and located in an RF plasma reactor.

Referring to FIG. 1, the insulating spacer means is referenced generally by the numeral 1. An optional bore 2 accepts an alignment shaft and allows the spacer means 1 to be positioned between two conductive plates 10. Where a multiplicity of pairs of conductive plates 10 are used, the shaft may position all plates and intervening spacer means 4. The conductive plates 10 are connected to an RF generator (not shown) and produce an RF plasma field in the area 5. Radial grooves 7 in both ends of the spacer means 1 forms portions of reduced circumference 8. The portions of reduced circumference of diameter (diameter B of FIG. 3) form the grooves at both ends of the insulated spacer 1 with the peripheral circumference of the portions of reduced circumference forming the bottom of the slot or grooves 7, with one side of the slot 7 being formed by an annular section of the surface of the spacer means 1 having a depth or width of "A-B" in FIG. 3. The opposite side or wall of the groove or channel 7 is formed by the area of the opposing conductive plate surface 10 immediately across from the annular rim or end portion of the insulated spacing means 1 as previously described. The annular or circumferential grooves 7 prohibit the formation of a plasma field in the area proximate the portions of reduced circumference 8 in the non-conductive material 4. As a result when a conductive film is being deposited on the workpieces, film deposition will be inhibited and the resulting build-up of a conductive film path between electrodes will form only at a very much reduced rate on the surface area proximate the radial groove 7 of the non-conductive material 4. In this manner, a direct conductive electrical path on the surface of the non-conductive material 4 between the conductive plates 10 will form only at a very much reduced rate as compared with prior art spacer means. The longitudinal electrically conductive path formed or built-up over the surface of the insulating material 4 of the spacer means 1 is largely irrelevant to the inhibition of shorting, inasmuch as extraneous deposited material is sufficiently conductive at deposition temperature to engender an effective short. Rather it is believed that the width "W" of the groove means 7 is analogous to the minimum spacing required to initiate the plasma—the so called "dark space" determined by the gaseous specie ionization path length. The dimension "W" is preferably on the order of 0.020 inches. Other than radial grooves maybe used, e.g. a helical groove extending along the spacer means as long as it completely encircles the insulating spacer means 1.

Even though plasma-induced deposition of a conductive material or film is largely inhibited by the groove means 7, thermal deposition of conductive material in the grooves 7 can still lead to failure of the insulator means 1. Thus, the depositions method should be chosen to minimize thermal decomposition, as described in more detail in the co-pending application cited hereinbefore. With such a method together with the iventive insulative spacer means in the system, over twenty runs have been achieved without the necessity for dismantling and cleaning the apparatus. The groove means 7 may also help inhibit thermal deposition because the mean free path of the gaseous specie is larger than the dimension W. Thus, conductive films may be advantageously deposited in a highcapacity plasma-deposition system without producing shorts.

Figure 2:
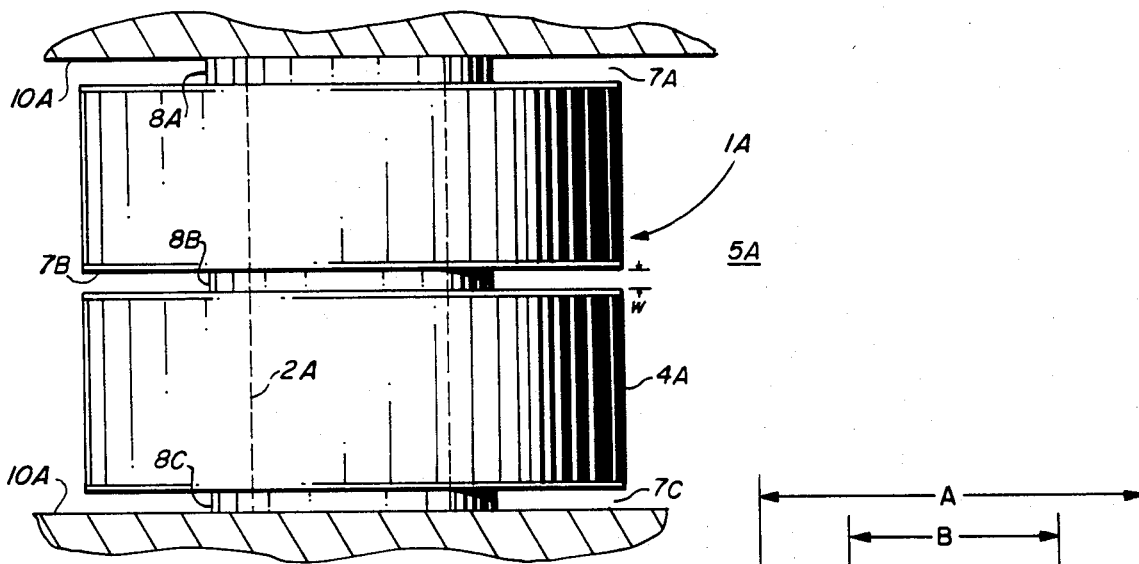
FIG. 2 is a side elevational view similar to FIG. 1 of the spacer member with an additional radial groove midway along a separating member.

Referring to FIG. 2, a second embodiment of the insulating spacer means is referenced generally by the number 1A. As in FIG. 1, a bore 2A allows a cylindric alignment shaft to position the spacer means 1 between two conductive plates 10A. A longitudinal series of radial grooves 7A, 7B and 7C prohibit the formation of a plasma field in the plurality of lengths of reduced circumference 8A, 8B and 8C in the non-conductive material 4A. As a result, the conductive film is not only inhibited at both ends of the non-conductive material as in FIG. 1, but also on its central length.

Figure 3:
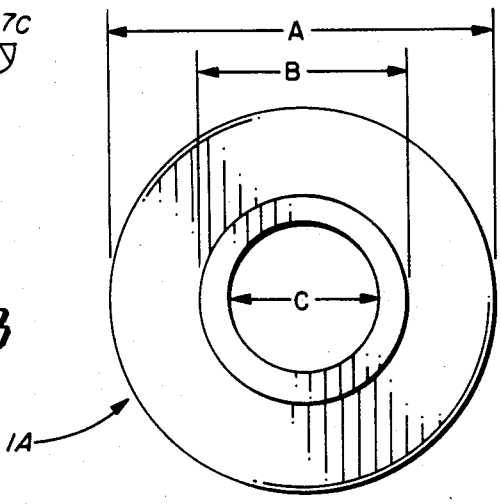
FIG. 3 is an end view of the inventive spacer member of FIG. 1.

Referring to FIG. 3, the insulating spacer means is referenced generally by the number 1A. Various dimensions are represented by A (outer diameter), B (groove diameter), and C (bore diameter). Exemplary values for the dimensions A, B and C are: 0.625 inches, 0.312 inches, and 0.250 inches, respectively. FIG. 3 also shows the groove-forming, reduced-circumference or decreased diameter portion of the insulator spacer 1 having an outside diameter "B" and an inside diameter "C" forming the outer walls of a hollow central bore adapted to receive an alignment shaft or spacer for positioning. The radial or annular slots or grooves 7 are formed to extend completely around the circumference, perimeter or outer periphery of the insulated spacer means 1. The insulating spacer means 1 has an intermediate portion having a larger diameter "A" and both the inter-mediate portion of diameter "A" and the reduced circumference portion of diameter "B" are cylindrical with upper and lower cylindrical faces being oppositely disposed toward or against the conductive plate surfaces 10 of adjacent electrodes. The upper and lower cylindrical faces shown in FIG. 3 are substantially parallel with the plane of the conductive plate surfaces 10 and the longitudinal axis of the insulating spacers 1 is generally perpendicular to the plane of the opposite conductive plate surfaces 10. The radially inward surface between the intermediate portion of diameter "A" and the portion of reduced diameter "B" proximate the end portions of the insulator spacer means 1 form one side of the groove or slot 7, and the conductive surface 10 forms the opposite slot side or wall which is parallel to or spaced apart from the first slot wall by the width of the bottom portion as determined by the length of the spacer provided with the reduced diameter "B" and this portion extends around the entire circumference or periphery of the end portion of the insulator 1. It is to be understood that all portions of the spaced insulator 1, including the portion of greater diameter "A", the portion of reduced diameter "B", and the end portions of the portion of greater diameter forming the first side or wall of the slot 7 and extending radially outward to form an annular ring around the portion of lesser diameter "B" which have their faces operatively disposed toward or against a corresponding conductive electrode surface 10. All except the extreme and portion or sidewall of the slot 7 formed by the conductive surface 10 itself include an insulating material such as quartz or alumina.

While the invention has been particularly described and shown in reference to the preferred embodiments thereof, it will be understood by those skilled in the art that various changes in form and detail and omissions may be made therein without departing from the spirit and scope of the invention. For example, the insulating spacer means 1 is preferably made of alumina; however, other insulating materials such as quartz can also be used.

What is claimed is:

1. In a radio frequency plasma apparatus for depositing an electrically conductive film by plasma enhanced chemical vapor deposition and including at least a pair of spaced apart, generally parallel electrically conductive plates for forming the plasma field therebetween, the improvement comprising:

insulated spacer means operably disposed within said plasma field for spacing apart said conductive plates;

said insulating spacer means being generally cylindrical and having a first diameter central portion including an axial aperture through the center thereof, said insulated spacer means further including a second diameter portion where the diameter is significantly reduced from said first diameter portion;

elongated cylindrical alignment means operably disposed within said central aperture for aligning and positioning said insulated spacer means between said conductive plates;

said portions of said reduced second diameter being operably disposed about the end portions of said first diameter central portion when said insulated spacer means is positioned between conductive plates, said reduced second diameter portions including a planer end surface adapted to be operably disposed against a corresponding conductive surface in abutting relationship thereto;

groove means disposed entirely around the circumference of said spacer means for inhibiting the formation of a plasma field in the area proximate the portions of reduced second diameter, said groove means including a first annular side portion disposed radially outwardly from said second portion of reduced diameter and having a thickness equal to the first diameter of the central portion of said insulated spacing means less said second reduced diameter portion, a second side portion formed by the annular area of the surface of a conductive plate surrounding said second portion of reduced diameter and a groove bottom portion formed from the peripheral outer surface of second reduced diameter portion; and said groove means for inhibiting the deposition of electrically conductive film material across the entire length of said insulated spacer means by substantially precluding the plasma field in the area proximate said groove means including the sides and bottoms thereof for inhibiting the formation of a inductive between said adjacent conductive plates and across the outer surface of said insulated spacer means thereby preventing a breakdown of the plasma field resulting in longer production runs, more production runs, and increased productivity between changing said insulated spacer means.

2. The improved plasma apparatus of claim 1 wherein said at least a pair of conducting plates includes more than 1 pair of conductive plates, one of said insulating spacing means being operably disposed between each pair of plates and said alignment cylinder being operably disposed within the central bore of said spacer means for properly aligning said spacer means and said plates.

3. The improved plasma apparatus of claim 1 wherein said spacer means further includes a reduced diameter portion intermediate the cylindrical space portions of said spacer means for forming an intermediately disposed groove entirely about the circumference of said spacer means for inhibiting the formation a plasma field therein so as to further delay an electrical breakdown by inhibiting the formation of an electrically conductive path of deposited conductive material across the insulated surfaces of said spacer means.

4. The improved plasma apparatus of claim 1 wherein said groove means includes a plurality of grooves operably disposed about the circumference of said spacer means intermediate the opposite ends thereof.

5. The plasma apparatus of claim 1 wherein the width of said groove means is analogous to the minimal space required for starting plasma operation.

6. The improved plasma apparatus of claim 1 wherein said groove means for at least partially inhibiting thermal deposition because the mean free path of the gaseous specie is greater than the width of said channel means.

7. The improved plasma apparatus of claim 1 wherein both the upper surface of the first diameter portion of said spacer means, the reduced diameter portion of said spacer means, and the annular wall portions therebetween include alumina as an insulation material.

8. The improved plasma apparatus of claim 1 wherein both the upper surface of the first diameter portion of said spacer means, the reduced diameter portion of said spacer means, and the annular wall portions therebetween include quartz as an insulation material.

9. A method of substantially prolonging the useful life of an insulated spacer element which spacially separates a pair of substantially parallel conductive plates in a plasma apparatus for plasma enhanced chemical vapor deposition comprising the steps of:

providing portions of reduced diameter at both ends of said insulated spacer element;

operably positioning said spacer element between said pair of conductive plates with the end portions having a reduced diameter operably disposed for contacting opposite conductive plates for maintaining the spacing therebetween;

forming at least one radial slot completely around the entire circumference of an intermediate portion of said insulated spacer element;

depositing conductive material on a product within said plasma apparatus while inadvertently depositing at least some of said conductive material onto said insulated spacer element;

inhibiting the formation of the plasma field within and around the portions of reduced diameter and within and around said radial slot to enable a direct conductive electrical path on the surface of the insulated spacer element from forming between adjacent conductive plates only at a very much reduced rate; and inhibiting a breakdown of the plasma field and a shutdown of the deposition operation for increased productivity.

* * * * *